(12) United States Patent
Davis (10) Patent No.: US 7,190,943 B2
(45) Date of Patent: Mar. 13, 2007

(54) SYSTEM AND METHOD FOR FREQUENCY TRANSLATION WITH HARMONIC SUPPRESSION USING MIXER STAGES

(75) Inventor: Thomas L. Davis, Carrollton, TX (US)

(73) Assignee: Microtune (Texas), L.P., Plano, TX (US)

( * ) Notice: Subject to any disclaimer, the term of this patent is extended or adjusted under 35 U.S.C. 154(b) by 500 days.

(21) Appl. No.: 10/663,824

(22) Filed: Sep. 16, 2003

(65) Prior Publication Data

US 2005/0059376 A1   Mar. 17, 2005

(51) Int. Cl.
  *H04B 1/26*   (2006.01)
(52) U.S. Cl. .................. 455/313; 455/316; 455/334
(58) Field of Classification Search ................ 455/313, 455/323, 334, 316, 318, 314, 315, 319, 317, 455/132, 137, 139, 189.1, 255
  See application file for complete search history.

(56) References Cited

U.S. PATENT DOCUMENTS

| | | | |
|---|---|---|---|
| 3,242,430 A * | 3/1966 | Ghose ........................ 455/137 |
| 4,157,505 A | 6/1979 | Owens ........................ 325/470 |
| 4,454,486 A | 6/1984 | Hassun et al. ............ 332/16 R |
| 5,194,871 A | 3/1993 | Counselman, III .......... 342/357 |
| 5,493,307 A * | 2/1996 | Tsujimoto ................... 455/313 |
| 5,930,697 A * | 7/1999 | Bohme et al. ............... 455/315 |
| 6,335,952 B1 | 1/2002 | Lee et al. .................... 375/327 |
| 6,763,230 B2 * | 7/2004 | Cheng ........................ 455/323 |
| 6,952,572 B2 * | 10/2005 | Wong et al. ................ 455/318 |
| 2002/0028667 A1 * | 3/2002 | Aoki .......................... 455/319 |
| 2003/0050031 A1 * | 3/2003 | Suzuki et al. ............... 455/265 |
| 2004/0132423 A1 * | 7/2004 | Oh et al. .................... 455/323 |
| 2004/0219901 A1 * | 11/2004 | Loke .......................... 455/318 |
| 2005/0096004 A1 * | 5/2005 | Tso et al. ................... 455/260 |
| 2005/0172718 A1 * | 8/2005 | Kalinin et al. ............. 455/323 |

FOREIGN PATENT DOCUMENTS

| | | |
|---|---|---|
| EP | 0 678 981 A2 | 4/1995 |
| EP | 0 678 981 | 10/1995 |
| EP | 0 883 237 A1 | 12/1998 |

OTHER PUBLICATIONS

Watanabe et al., "Integrated Mixer Design," Motorola Inc., Semiconductor Products Sector, pp. 1-4.
Leong et al., "Monolithic RF Active Mixer Design," IEEE Transactions on Circuits and Systems—II: Analog and Digital Signal Processing, vol. 46, No. 3, pp. 231-239, Mar. 1999.

(Continued)

*Primary Examiner*—Lana Le
(74) *Attorney, Agent, or Firm*—Baker Botts L.L.P.

(57) ABSTRACT

A circuit for frequency translating a radio frequency signal comprises a plurality of mixer stages, each stage associated with a particular range of frequencies of a radio frequency signal. The circuit further comprises a switching circuit that communicates the radio frequency signal to a selected one of the plurality of mixer stages in response to a control signal. The selected mixer stage comprises a phase generation circuit that generates a plurality of phase signals, and at least one mixer that combines the radio frequency signal with one of the plurality of phase signals to generate at least a portion of an intermediate frequency signal.

20 Claims, 5 Drawing Sheets

OTHER PUBLICATIONS

Weldon et al., "10.4: A 1.75GHz Highly-Integrated Narrow-Band CMOS Transmitter with Harmonic-Rejection Mixers," ISSCC 2001 Visuals Supplement/IEEE, pp. 126-127 and 420, 2001.

Weldon et al., "10.4: A 1.75GHz Highly-Integrated Narrow-Band CMOS Transmitter with Harmonic-Rejection Mixers," IEEE International Solid-State Circuits Conference, pp. 160-161 and 442, 2001.

Weldon et al., "A 1.75GHz Highly Integrated Narrow-Band CMOS Transmitter with Harmonic-Rejection Mixers," IEEE Journal of Solid-State Circuits, vol. 36, No. 12, pp. 2003-2015, Dec. 2001.

PCT/US2005/000556, Notification of Transmittal of the International Search Report and the Written Opinion of the International Searching Authority, or the Declaration, 14 pages, May 23, 2005.

Lee Goldberg; *"Foundations for Commnication's Future Laid at CICC '98"*; Electronic Design; pp. 52, 54, 56, 58, May 1, 1998.

PCT/US2004/030126, Notification of Transmittal of the International Search Report and the Written Opinion of the International Searching Authority, or the Declaration, 7 pgs, Jan. 28, 2005.

\* cited by examiner

| BAND OR CHANNEL | TUNED FREQ RANGE (MHz) | N | M | FIRST SPUR HARMONIC | FIRST SPUR FREQ (MHz) | VCO RANGE (MHz) |
|---|---|---|---|---|---|---|
| 1 | 57.000-106.125 | 8 | 32 | 15 | 855 | 1824-3396 |
| 2 | 106.125-212.250 | 8 | 16 | 15 | 1592 | 1698-3396 |
| 3 | 212.250-424.500 | 4 | 8 | 7 | 1485 | 1698-3396 |
| 4 | 424.500-849.000 | 2 | 4 | 3 | 1274 | 1698-3396 |

SYSTEM AND METHOD FOR FREQUENCY TRANSLATION WITH HARMONIC SUPPRESSION USING MIXER STAGES

TECHNICAL FIELD OF THE INVENTION

This invention relates to circuits and more particularly to frequency translation with harmonic suppression using mixer stages.

BACKGROUND OF THE INVENTION

Mixers are the circuit blocks of a communication system that perform frequency translation of the carrier signals. Mixers are therefore used to frequency translate a desired radio frequency (RF) signal from a broadband signal to an intermediate frequency (IF) signal. Ideally, a frequency translation receiver, such as a direct down-conversion receiver, using a mixer multiplies the RF signal of interest by a pure sine wave, known as the local oscillator (LO) signal. This ideal multiplication produces signals only at the sum and difference of the RF and LO frequencies. With low pass filtering of the multiplier output, the receiver responds only to the signals at the frequency of interest, i.e. RF signals in a small band centered about the LO frequency.

Unfortunately, ideal multipliers are not practical for a variety of reasons. Currently, standard integrated circuit (IC) practice is to implement the mixing process with a Gilbert cell. A Gilbert cell essentially multiplies the RF signal by a square wave rather than an ideal sine-wave. Because of the odd harmonics of a square wave, a receiver utilizing a Gilbert cell mixer responds to RF signals at each of the odd harmonics of the LO. Response to the first harmonic is strongest; higher harmonics have a weaker, but significant, response. For example, the third and fifth harmonic responses are 9.5 and 14 dB below the first harmonic, respectively. Prior approaches address the harmonic problem by placing a pre-selection filter before the mixer. For wide band applications, the filter must be tunable. The filter passes only the RF signal of interest and greatly attenuates its harmonics. Since harmonics of the RF signal never reach the mixer, the receiver responds only to the signal of interest. Unfortunately, a suitable pre-select filter is difficult or impossible to implement with current IC technology.

SUMMARY OF THE INVENTION

In accordance with the present invention, the disadvantages and problems associated with prior frequency translation circuits have been substantially reduced or eliminated.

In accordance with one embodiment of the present invention, a circuit for frequency translating a radio frequency signal comprises a plurality of mixer stages, each stage associated with a particular range of frequencies of a radio frequency signal. The circuit further comprises a switching circuit that communicates the radio frequency signal to a selected one of the plurality of mixer stages in response to a control signal. The selected mixer stage comprises a phase generation circuit that generates a plurality of phase signals, and at least one mixer that combines the radio frequency signal with one of the plurality of phase signals to generate at least a portion of an intermediate frequency signal.

The following technical advantages may be achieved by some, none, or all of the embodiments of the present invention. Technical advantages of the frequency translation circuit include suppression of the harmonics associated with a fundament frequency for a signal of interest. These and other advantages, features, and objects of the present invention will be more readily understood in view of the following detailed description and the drawings.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF EXAMPLE EMBODIMENTS

Figure 1:
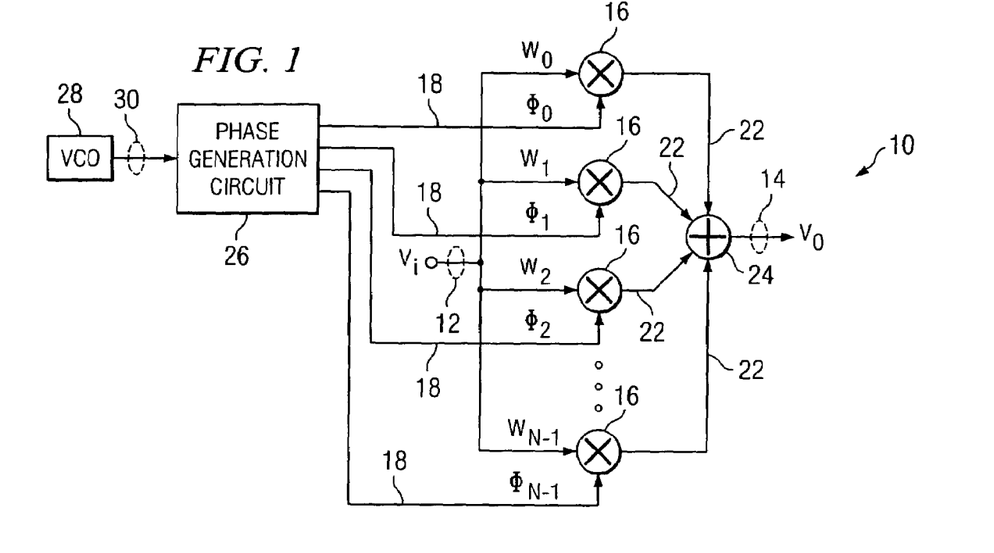
FIG. 1 illustrates one embodiment of a circuit for suppressing the harmonics of a radio frequency signal according to the teachings of the present invention.

FIG. 1 illustrates one embodiment of a circuit 10 for suppressing the harmonics of a radio frequency (RF) signal 12 to be frequency translated (e.g., down-converted or up-converted) to an intermediate frequency (IF) signal 14. Circuit 10 comprises an array of N mixers 16 to approximate the multiplication of RF signal 12 by an ideal sine-wave. Each mixer 16 multiplies the RF signal 12 by a phase signal 18 having a magnitude of, for example, either plus or minus one. The RF signal 12 is weighted according to a weighting factor (e.g., multiplied by $w_i$) before the input to each mixer 16. All mixer outputs 22 are summed by a summing circuit 24 to generate the IF signal 14.

Figure 2:
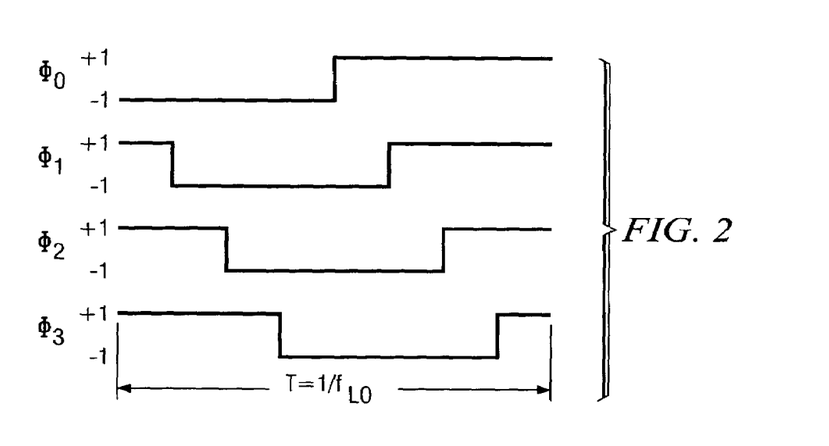
FIG. 2 illustrates phase signals to be used in the circuit of FIG. 1.

In a television system, signals representing individual channels are assigned to specific frequencies in a defined frequency band. For example, in the United States, television signals are generally transmitted in a band from 48 MHz to 852 MHz. In such television systems, RF signal 12 comprises a radio frequency signal in the band from 48 MHz to 852 MHz. The phase signal 18 of each of the mixers 16 is a square wave generated by phase generation circuit 26 at the frequency of interest (e.g., frequency of the signal of interest). As an example, FIG. 2 illustrates the phase relationship between the phase signals 18 for an array of four mixers 16. These staggered phase signals 18 can be generated by digital logic clocked by a voltage controlled oscillator (VCO) 28 that runs at a multiple (e.g., 2N) of the frequency of interest and that provides a VCO signal 30 to phase generation circuit 26. In general, IF signal 14 comprises a combination of RF signal 12 and phase signals 18. If the RF signal 12 is up-converted, then $f_{IF}=f_{RF}+f_{LO}$. If the RF signal 12 is down-converted, then $f_{IF}=f_{RF}-f_{LO}$. IF signal 14 may include a real part, I, and an imaginary part, Q, as discussed in greater detail below.

Mixers 16 comprise any suitable device or circuitry that multiplies an RF signal 12 with a phase signal 18 to generate an IF signal 14, or at least an output 22 that comprises a portion of IF signal 14. Mixers may be formed using suitable Bipolar, CMOS and BiCMOS transistor technologies. In a particular embodiment, mixers 16 comprise double-balanced quad mixers, which are often referred to as Gilbert cell mixers. In such a mixer, for example, an input signal voltage is converted to a current using an emitter coupled pair. The current is then switched back and forth by a quad switch to produce frequency conversion of the input signal. However, mixers 16 may comprise any of double-balanced, single-balanced, or unbalanced designs. Moreover, mixers 16 may be active or passive. Summing circuit 24 comprises any suitable device or circuitry that adds signals 22 from mixers 16 to form IF signal 14. In a particular embodiment, summing of the mixer outputs 22 is accomplished by wire-ORing the collectors of the Gilbert cell outputs. The weighting factors 20 can be applied to mixers 16 using the emitter load in the $g_m$ section of the Gilbert cells.

Phase generation circuit 26 comprises any suitable combination and arrangement of devices used to generate the phase signals 18 described herein. Examples of phase generation circuit 26 are provided in later FIGURES. In general, a voltage controlled oscillator 28 comprises an oscillator where a control voltage controls the oscillator output frequency. VCO 28 can be built using many circuit techniques. In one embodiment, the buffered output of VCO 28 is used to drive phase generation circuit 26 and, ultimately, mixers 16. In order to precisely tune and stabilize VCO 28, a phase lock loop (PLY) maybe used to lock the VCO 28 to a multiple of a reference frequency provided by a crystal oscillator. For television system applications, a reference frequency of 4 MHz may be used.

Figure 3:
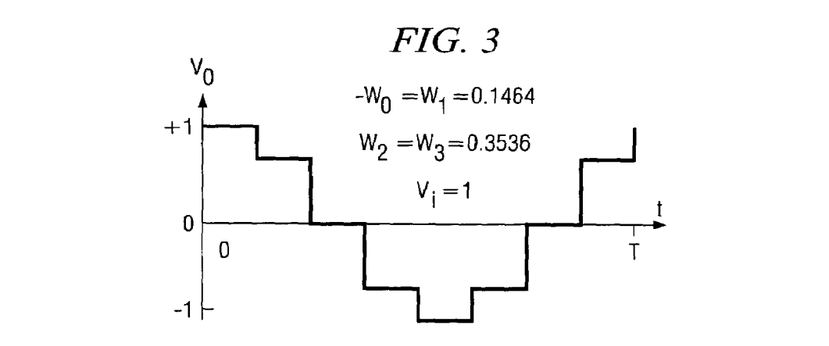
FIG. 3 illustrates an intermediate frequency signal generated by the circuit of FIG. 1.

FIG. 3 illustrates the IF signal 14, $V_O$, of circuit 10 versus time with the RF signal 12, $V_i$, held at one. With appropriate weighting factors, $w_i$, applied to mixers 16, the IF signal 14 contains no third, fifth or even harmonics. In general, any number of harmonics can be suppressed by increasing the number of mixers 16 and associated phase signals 18. For N mixers numbered 0,1,2 ... N−1, the phase signal 18 of mixer i is given by the following equation:

$$\phi_i(t) = \phi_0\left(t - \frac{T}{2N}i\right) \text{ for } i = 1, 2 \ldots N-1$$

where $\Phi_0(t)$ is a ±1 square wave at the local oscillator fundamental frequency, $f_{LO}$.

If one cycle of the desired, sampled phase signal 18 is given by the following equation:

$$v_{LO}(k) = \cos\left(\pi \frac{k}{N}\right) \text{ for } k = 0, 1, 2 \ldots 2N-1$$

Then it can be shown that the weighting factors, $w_i$, are given by the following equation:

$$w_i = \sin\left(\frac{\pi}{2N}(2i-1)\right)\sin\left(\frac{\pi}{2N}\right) \text{ for } k = 0, 1, 2 \ldots N-1.$$

Ignoring signs, this results in N/2 unique weighting factors, $w_i$.

According to a second embodiment, the phase signals 18 are sampled according to the following equation:

$$v_{LO}(k) = \cos\left(\pi \frac{k+0.5}{N}\right) \text{ for } k = 0, 1, 2 \ldots 2N-1$$

In this case, the weighting factors, $w_i$, are given by the following equation:

$$w_i = \sin\left(\frac{\pi}{N}i\right)\sin\left(\frac{\pi}{2N}\right) \text{ for } i = 0, 1, 2 \ldots N-1.$$

This also results in N/2 unique weighting factors, $w_i$, but eliminates one mixer 16 since $w_o$ is zero.

For I-Q frequency translation, the quadrature mixers 16 are identical to the in-phase mixers 16 illustrated in FIG. 1 except that the phase signals 18 applied to the quadrature mixers 16 are shifted by ninety degrees and/or inverted. To simplify the ninety degree shift, N may be chosen to be an even number. In this case, the spectrum of the equivalent complex phase signals 18 is zero except at frequencies $(2Nm+1) f_{LO}$ where m is any integer. The first problem spur (lowest frequency) occurs at $(1-2N)f_{LO}$.

A frequency translation receiver, such as a direct-down conversion receiver, is a primary application for harmonic suppression mixing. In order to illustrate its application, an example is presented. Assume that the direct-down conversion receiver is designed to tune to an RF signal 12 having signals between from 57 to 849 MHz (e.g., cable television signals) and that no RF energy exists above 852 MHz. One approach is to implement the direct-down conversion receiver with a pair (I and Q) of 8-phase (e.g., N=8 for a total of sixteen mixers 16) harmonic suppression mixers 16. The mixer pair will produce no unsuppressed spurious responses to any frequencies within the band. Consider the most demanding requirement. At the lowest tuned frequency ($f_{LO}$=57 MHz), the first unsuppressed spurious response occurs at $(1-2N) f_{LO}$ =−15, $f_{LO}$ =855 MHz. Since this response is greater than the highest in-band frequency (852 MHz), an 8-phase mixer pair is adequate for this application.

For the best harmonic rejection (and I/Q quadrature), the phase signals 18 should be generated using synchronously clocked (using the VCO as the clock) digital logic. This means that the highest VCO frequency is 2N $f_{LO}$=2*8*849 MHz=13.584 GHz. A technique to lower the VCO frequency would increase the usefulness of system 10.

Figure 4:
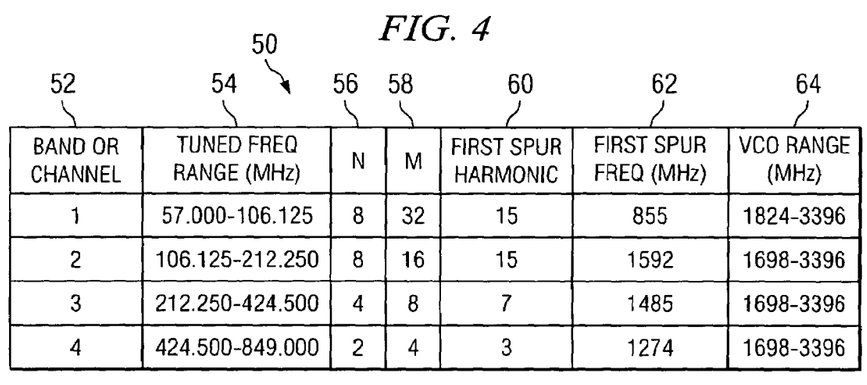
FIG. 4 illustrates a table with example data for the operation of the circuit in FIG. 1.

FIG. 4 illustrates a table 50 that shows how the example design can be broken into four frequency bands where all but the first band span an octave. Although FIG. 4 is illustrated and the remaining FIGURES are described with reference to four bands of RF signal 12, it should be understood that RF signal 12 may be associated with any suitable number and arrangement of radio frequency bands according to particular needs or desires. Table 50 comprises columns 52–64. Columns 52 and 54 identify the band and corresponding tuned frequency range associated with the signal of interest. Column 56 identifies the number, N, of distinct phase signals 18 used for each band and tuned frequency range. Column 58 identifies the VCO division factor, M, used to generate $\Phi_0$. The remaining phase signals 18 are generated by delaying $\Phi_0$ with delay elements, such as D-flip-flops, as explained in detail below. Column 60 illustrates the lowest harmonic that is not suppressed by the circuit 10. This is also referred to as the first spur harmonic. Column 62 illustrates the worst case spur frequency, i.e. the frequency of the lowest unsuppressed spur when tuned to the low end of the band. Column 64 illustrates the VCO tuning range used to generate phase signals 18 for any given band.

Figure 5:
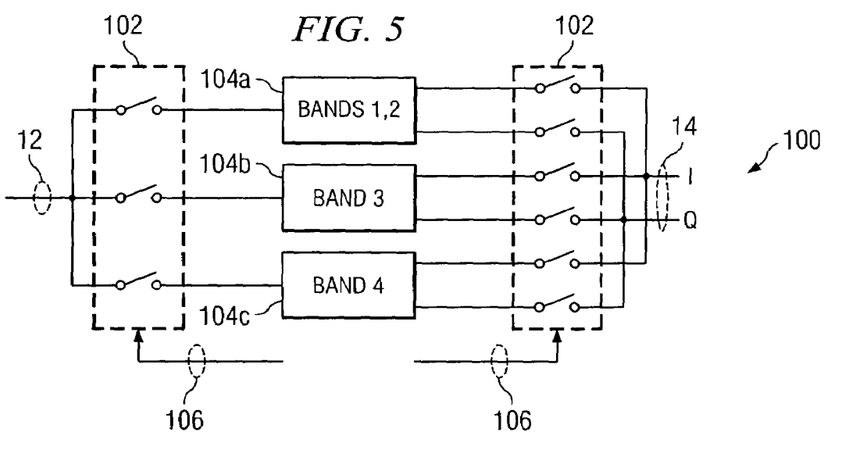
FIG. 5 illustrates one embodiment of a circuit that uses a switching circuit and a plurality of mixer stages to suppress the harmonics of a radio frequency signal.

Referring to FIG. 5, the first technique is illustrated by circuit 100 that comprises switching circuit 102 coupled to a plurality of mixer stages 104a–c. Mixer stages 104a–c are referred to collectively as mixer stages 104 and generically as mixer stage 104. Each mixer stage 104 is configured to work with a particular range of frequencies, or bands, of RF signal 12. For example, mixer stage 104a is associated with bands 1 and 2 of RF signal 12. Mixer stage 104b is associated with band 3 of RF signal 12. Mixer stage 104c is associated with band 4 of RF signal 12. Each mixer stage 104 and its configuration and operation is described in greater detail with reference to FIGS. 6–14.

Switching circuit 102 may be implemented using any suitable number, combination, and arrangement of digital and analog switching techniques, and is depicted as a series of mechanical switches for illustrative purposes only. In the embodiment depicted in FIG. 5, switching circuit 102 communicates RF signal 12 to a selected one of the plurality of mixer stages 104 in response to a control signal 106. The control signal 106 may be generated by other parts of a direct down-conversion receiver, for example, such as by a tuner. Control signal 106 may instruct switching circuit 102 to communicate RF signal 12 to a particular mixer stage 104 or may include information about the frequency or band of frequencies associated with the signal of interest, and switching circuit 102 may determine thereupon the appropriate mixer stage 104 to which to communicate RF signal 12. By communicating RF signal 12 to a selected mixer stage 104 according to the frequency band within which the signal of interest resides, circuit 100 ensures that appropriate harmonic suppression mixers and phase generation logic are used to frequency translate the RF signal 12 to an IF signal 14.

Figure 6:
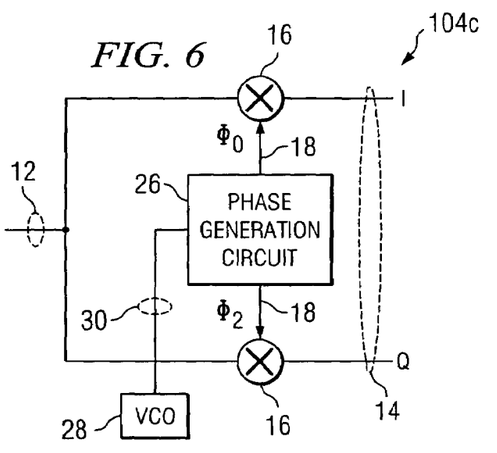
FIG. 6 illustrates one embodiment of a mixer stage used in the circuit of FIG. 5.

FIG. 6 illustrates one embodiment of mixer stage 104c that includes mixers 16 and phase generation circuit 26 that generates phase signals 18 in response to VCO signal 30 from VCO 28. Mixer stage 104c is configured to frequency translate an RF signal 12 having a signal of interest in band 4 (e.g., 424.5–849 MHz). According to table 50 of FIG. 4, the number of phases, N, for band 4 is two (e.g., $\Phi_0$ and $\Phi_2$). Each mixer 16 of mixer stage 104c combines the RF signal 12 with the appropriate phase signal 18 to form at least a portion of IF signal 14. IF signal 14 comprises a real part, I, and an imaginary part, Q.

Figure 7:
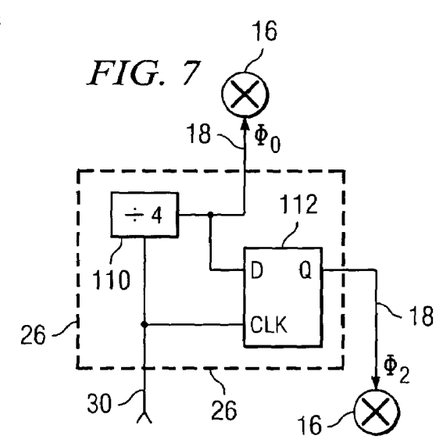
FIG. 7 illustrates one embodiment of a phase generation circuit used in the mixer stage of FIG. 6.
Figure 8:
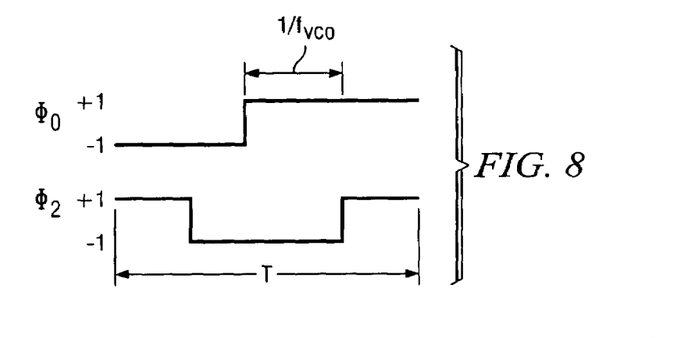
FIG. 8 illustrates one embodiment of phase signals generated by the phase generation circuit of FIG. 7.

FIG. 7 illustrates one embodiment of phase generation circuit 26 used in mixer stage 104c. Phase generation circuit 26 comprises a frequency divider circuit 110 coupled to a delay circuit 112. Frequency divider circuit 110, also referred to as a "divide-by-N" circuit, divides the frequency of incoming VCO signal 30 by a division factor, M. Frequency divider 110 of FIG. 7 has a division factor, M, of four, as illustrated in table 50 for band 4. Delay circuit 112 may comprise a flip-flop circuit, such as a D-flip-flop circuit having D and CLK inputs and Q and –Q outputs. Phase generation circuit 26 of FIG. 7 generates phase signals 18 (e.g., $\phi_0$ and $\phi_2$) illustrated in FIG. 8.

Figure 9:
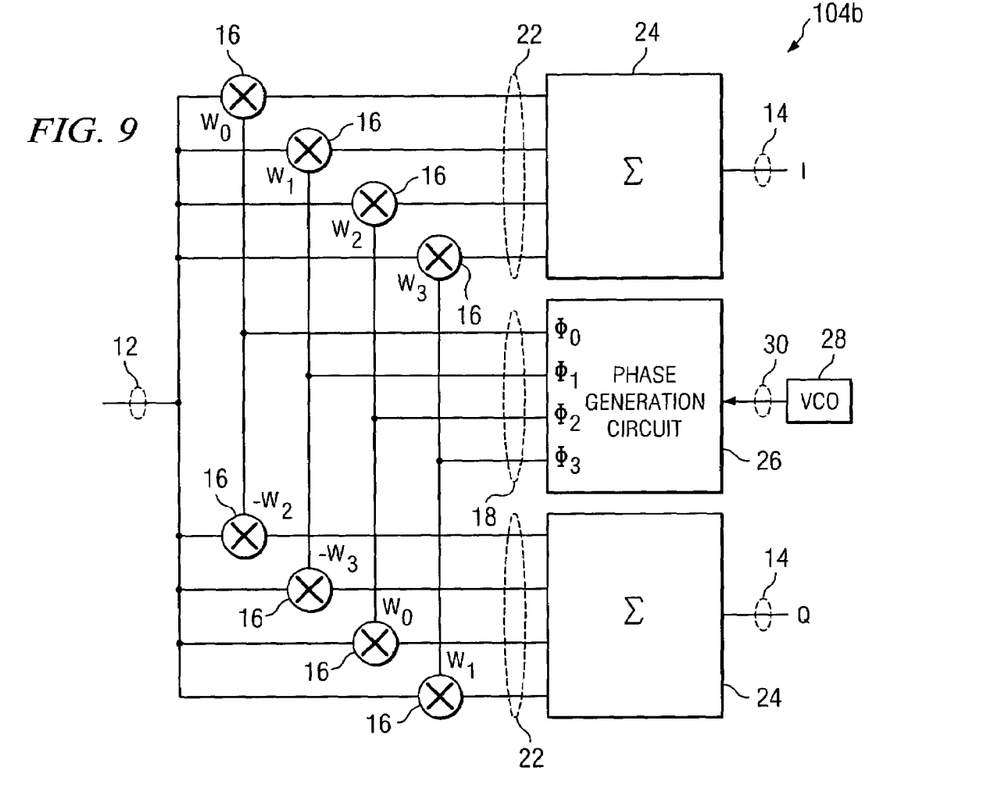
FIG. 9 illustrates another embodiment of a mixer stage used in the circuit of FIG. 5.

FIG. 9 illustrates one embodiment of mixer stage 104b that includes mixers 16 and phase generation circuit 26 that generates phase signals 18 in response to VCO signal 30 from VCO 28. Mixer stage 104b is configured to frequency translate an RF signal 12 having a signal of interest in band 3 (e.g., 212.25–424.5 MHz). According to table 50 of FIG. 4, the number of phases, N, for band 3 is four (e.g., $\phi_0$, $\phi_1$, $\phi_2$ and $\phi_3$). Each mixer 16 of mixer stage 104b combines the RF signal 12 with the appropriate phase signal 18 to form at least a portion of IF signal 14. An appropriate weighting factor, $w_i$, is also applied to RF signal 12 before it is received by each mixer 16. The weighting factors, $w_i$, of the second set of mixers 16 (e.g., used to generate Q part of IF signal 14) are shifted and/or inverted with respect to the weighting factors, $w_i$, of the first set of mixers 16 (e.g., used to generate the I part of IF signal 14). This is done in order to appropriately shift the phase signals 18 applied to the second set of mixers 16 by ninety degrees. Summing circuits 24 combine the outputs 22 of mixers 16 to generate IF signal 14 having a real part, I, and an imaginary part, Q.

Figure 10:
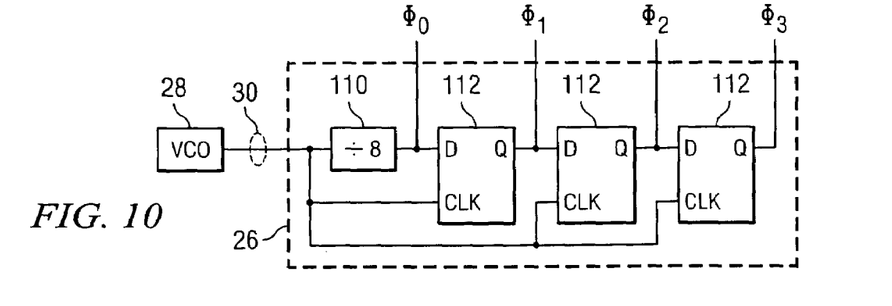
FIG. 10 illustrates one embodiment of a phase generation circuit used in the mixer stage of FIG. 9.
Figure 11:
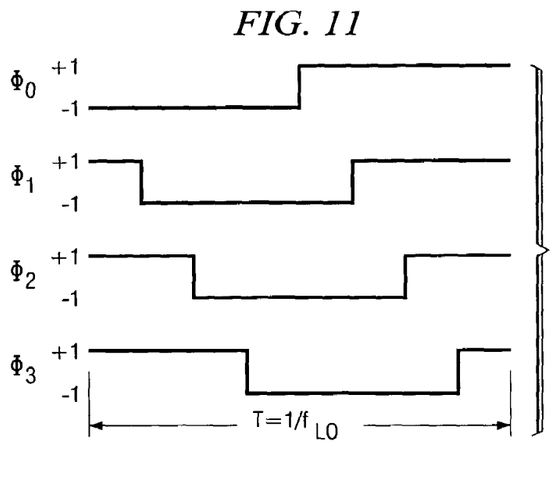
FIG. 11 illustrates one embodiment of phase signals generated by the phase generation circuit of FIG. 10.

FIG. 10 illustrates one embodiment of phase generation circuit 26 used in mixer stage 104b. Phase generation circuit 26 comprises a frequency divider circuit 110 coupled to a plurality of delay circuits 112. Frequency divider 110 of FIG. 10 has a division factor, M, of eight, as illustrated in table 70 for band 3. Phase generation circuit 26 of FIG. 10 generates phase signals 18 (e.g., $\phi_0$, $\phi_1$, $\phi_2$ and $\phi_3$) illustrated in FIG. 11.

Figure 12:
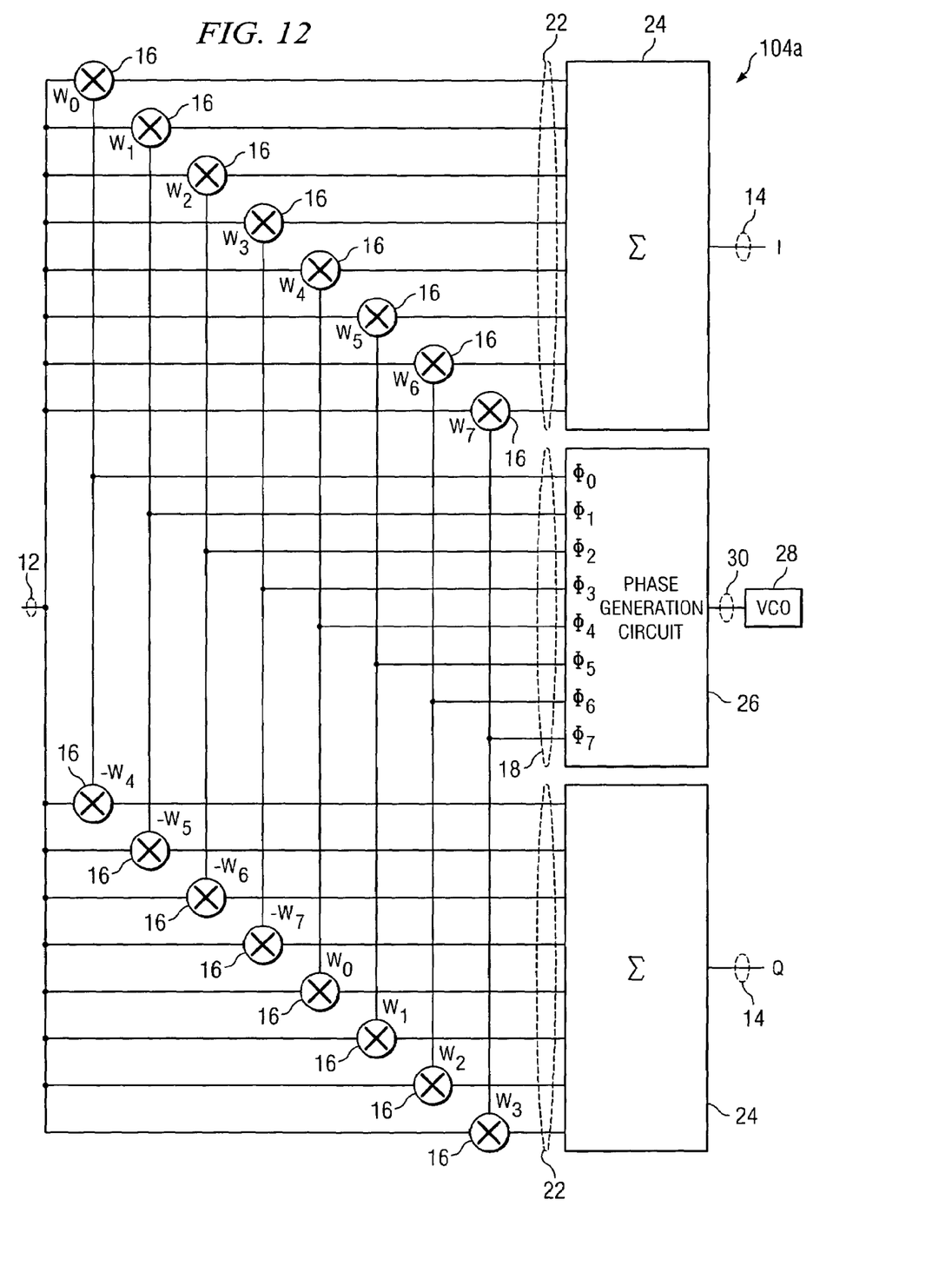
FIG. 12 illustrates yet another embodiment of a mixer stage used in the circuit of FIG. 5.

FIG. 12 illustrates one embodiment of mixer stage 104a that includes mixers 16 and phase generation circuit 26 that generates phase signals 18 in response to VCO signal 30 from VCO 28. Mixer stage 104a is configured to frequency translate an RF signal 12 having a signal of interest in either of band 1 (e.g., 57–106.125 MHz) or band 2 (e.g., 106.125–212.25 MHz). According to table 50 of FIG. 4, the number of phases, N, for bands 1 and 2 is eight (e.g., $\phi_0$, $\phi_1$, $\phi_2$, $\phi_3$, $\phi_4$, $\phi_5$, $\phi_6$ and $\phi_7$). An appropriate weighting factor, $w_i$, is also applied to RF signal 12 before it is received by each mixer 16. The weighting factors, $w_i$, of the second set of mixers 16 (e.g., used to generate Q part of IF signal 14) are shifted and/or inverted with respect to the weighting factors, $w_i$, of the first set of mixers 16 (e.g., used to generate the I part of IF signal 14). This is done in order to appropriately shift the phase signals 18 applied to the second set of mixers 16 by ninety degrees. Summing circuits 24 combine the outputs 22 of mixers 16 to generate IF signal 14 having a real part, I, and an imaginary part, Q.

Figure 13:
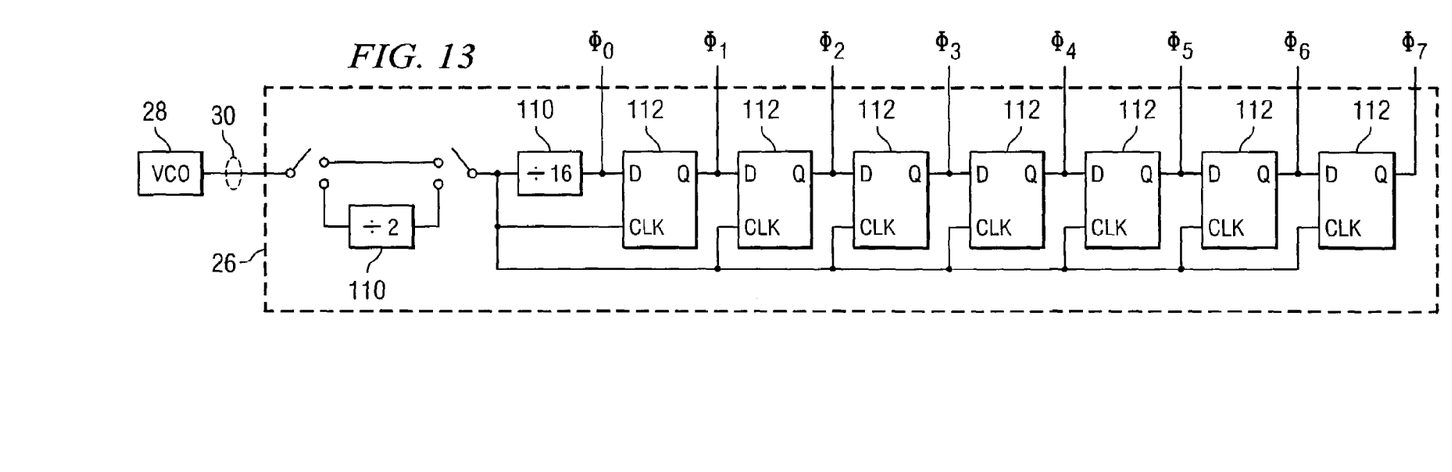
FIG. 13 illustrates one embodiment of a phase generation circuit used in the mixer stage of FIG. 12.
Figure 14:
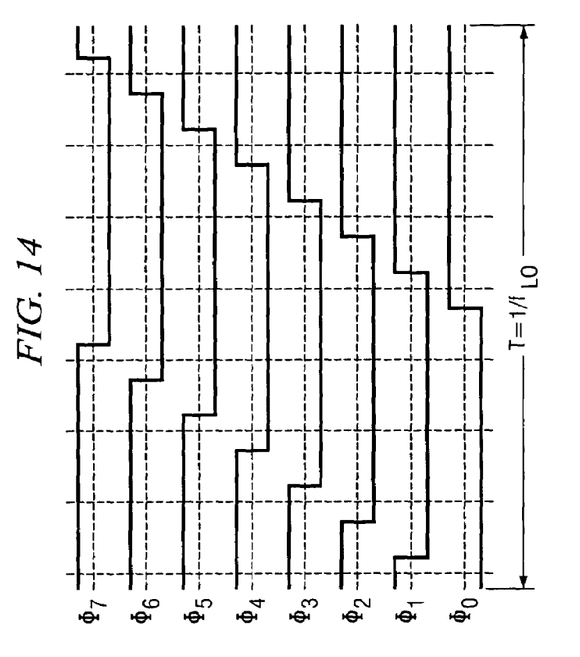
FIG. 14 illustrates one embodiment of phase signals generated by the phase generation circuit of FIG. 13.

FIG. 13 illustrates one embodiment of phase generation circuit 26 used in mixer stage 104a. Phase generation circuit 26 comprises at least one frequency divider circuit 110 coupled to a plurality of delay circuits 112. When used for band 2, frequency divider 110 of FIG. 13 has a division factor, M, of sixteen, as illustrated in table 70 for band 2. Phase generation circuit 26 of FIG. 13 generates phase signals 18 (e.g., $\phi_0$, $\phi_1$, $\phi_2$, $\phi_3$, $\phi_4$, $\phi_5$, $\phi_6$ and $\phi_7$) illustrated in FIG. 14 used for band 2. When used for band 1, another frequency divider circuit 110 having a division factor, M, of 2, is switched into communication with frequency divider circuit 100 having a division factor, M, of sixteen to create an effective division factor of thirty-two, as illustrated in table 70 for band 1. Phase generation circuit 26 of FIG. 13 generates phase signals 18 (e.g., $\phi_0$, $\phi_1$, $\phi_2$, $\phi_3$, $\phi_4$, $\phi_5$, $\phi_6$ and $\phi_7$) illustrated in FIG. 14 used for band 1.

Although embodiments of the invention and their advantages are described in detail, a person skilled in the art could make various alterations, additions, and omissions without departing from the spirit and scope of the present invention as defined by the appended claims.

What is claimed is:

1. A circuit for frequency translating a radio frequency signal, comprising:
   a plurality of mixer stages, each mixer stage associated with a particular range of frequencies of a radio frequency signal; and
   a switching circuit operable to communicate the radio frequency signal to a selected one of the plurality of mixer stages in response to a control signal;
   the selected mixer stage comprising:
      a phase generation circuit operable to generate a plurality of phase signals;
      a first mixer operable to combine the radio frequency signal weighted according to a first weighting factor with a first phase signal to generate a first output;
      a second mixer operable to combine the radio frequency signal weighted according to a second weighting factor with a second phase signal to generate a second output;
      a third mixer operable to combine the radio frequency signal weighted according to a third weighting factor with a third phase signal to generate a third output;
      a fourth mixer operable to combine the radio frequency signal weighted according to a fourth weighting factor with a fourth phase signal to generate a fourth output; and
      a summing circuit operable to combine the first, second, third, and fourth outputs to generate at least a portion of the intermediate frequency signal;
   wherein:
   the radio frequency signal comprises a bandwidth approximately ranging from 48 MHz to 852 MHz; and
   the radio frequency signal comprises a signal of interest approximately ranging from 212 MHz to 424 MHz.

2. The circuit of claim 1, wherein the phase generation circuit comprises a frequency divider having a division factor of eight coupled to a plurality of delay circuits to generate the first, second, third, and fourth phase signals.

3. A circuit for frequency translating a radio frequency signal, comprising:
   a plurality of mixer stages, each mixer stage associated with a particular range of frequencies of a radio frequency signal; and
   a switching circuit operable to communicate the radio frequency signal to a selected one of the plurality of mixer stages in response to a control signal;
   the selected mixer stage comprising:
      a phase generation circuit operable to generate a plurality of phase signals;
      a first mixer operable to combine the radio frequency signal weighted according to a first weighting factor with a first phase signal to generate a first output;
      a second mixer operable to combine the radio frequency signal weighted according to a second weighting factor with a second phase signal to generate a second output;
      a third mixer operable to combine the radio frequency signal weighted according to a third weighting factor with a third phase signal to generate a third output;
      a fourth mixer operable to combine the radio frequency signal weighted according to a fourth weighting factor with a fourth phase signal to generate a fourth output;
      a fifth mixer operable to combine the radio frequency signal weighted according to a fifth weighting factor with a fifth phase signal to generate a fifth output;
      a sixth mixer operable to combine the radio frequency signal weighted according to a sixth weighting factor with a sixth phase signal to generate a sixth output;
      a seventh mixer operable to combine the radio frequency signal weighted according to a seventh weighting factor with a seventh phase signal to generate a seventh output;
      an eighth mixer operable to combine the radio frequency signal weighted according to an eighth weighting factor with an eighth phase signal to generate an eighth output; and
      a summing circuit operable to combine the first, second, third, fourth, fifth, sixth, seventh, and eighth outputs to generate at least a portion of the intermediate frequency signals;
   wherein:
   the radio frejuency signal comprises a bandwidth approximately ranging from 48 MHz to 852 MHz;
   the radio frequency signal comprises a signal of interest ranging from 57 MHz to 212 MHz.

4. The circuit of claim 3, wherein:
   the radio frequency signal comprises a signal of interest within the range of 106 MHz to 213 MHz; and
   the phase generation circuit comprises a frequency divider having a division factor of sixteen coupled to a plurality of delay circuits to generate the first, second, third, fourth, fifth, sixth, seventh, and eighth phase signals.

5. The circuit of claim 3, wherein:
   the radio frequency signal comprises a signal of interest within the range of 57 MHz to 107 MHz; and
   the phase generation circuit comprises a frequency divider having a division factor of thirty-two coupled to a plurality of delay circuits to generate the first, second, third, fourth, fifth, sixth, seventh, and eighth phase signals.

6. The circuit of claim 3, wherein:
   the summing circuit comprises a first summing circuit; and
   the intermediate frequency signal comprises a real part and an imaginary part, the real part formed by the first summing circuit; and
   the circuit further comprising:
      a plurality of additional mixers, each additional mixer corresponding to one of the first, second, third, fourth, fifth, sixth, seventh, and eighth mixers; and
      a second summing circuit operable to combine outputs of the additional mixers to form the imaginary part of the intermediate frequency circuit.

7. The circuit of claim 3, wherein the control signal identifies at least one of a signal of interest or a particular range of frequencies associated with a signal of interest.

8. The circuit of claim 1, wherein the control signal identifies at least one of a signal of interest or a particular range of frequencies associated with a signal of interest.

9. The circuit of claim 1, wherein:
   the summing circuit comprises a first summing circuit; and the intermediate frequency signal comprises a real part and an imaginary part, the real part formed by the first summing circuit; and the circuit further comprising:
a plurality of additional mixers, each additional mixer corresponding to one of the first, second, third, and fourth mixers; and
a second summing circuit operable to combine outputs of the additional mixers to form the imaginary part of the intermediate frequency signal.

10. A circuit for frequency translating a radio frequency signal, comprising:
a plurality of stages, each stage associated with a particular range of frequencies of a radio frequency signal; and
a switching circuit operable to communicate the radio frequency signal to a selected one of the plurality of stages in response to a control signal;
the selected stage comprising:
means for generating a plurality of phase signals; and
first means for combining the radio frequency signal weighted according to a first weighting factor with a first phase signal to generate a first output;
second means for combining the radio frequency signal weighted according to a second weighting factor with a second phase signal to generate a second output;
third means for combining the radio frequency signal weighted according to a third weighting factor with a third phase signal to generate a third output;
fourth means for combining the radio frequency signal weighted according to a fourth weighting factor with a fourth phase signal to generate a fourth output; and
means for summing the first, second, third, and fourth outputs to generate at least a portion of the intermediate frequency signal;
wherein:
the radio frequency signal comprises a bandwidth approximately ranging from 48 MHz to 852 MHz;
the radio frequency signal comprises a signal of interest approximately ranging from 212 MHz to 424 MHz.

11. The circuit of claim 10, wherein the means for generating comprises a frequency divider having a division factor of eight coupled to a plurality of delay circuits to generate the first, second, third, and fourth phase signals.

12. The circuit of claim 10, wherein the control signal identifies at least one of a signal of interest or a particular range of frequencies associated with a signal of interest.

13. A circuit for frequency translating a radio frequency signal, comprising:
a plurality of stages each stage associated with a particular range of frequencies of a radio frequency signal; and
a switching circuit operable to communicate the radio frequency signal to a selected one of the plurality of stages in response to a control signal;
the selected stage comprising:
means for generating a plurality of phase signals; and
a first means for combining the radio frequency signal weighted according to a first weighting factor with a first phase signal to generate a first output;
a second means for combining the radio frequency signal weighted according to a second weighting factor with a second phase signal to generate a second output;
a third means for combining the radio frequency signal weighted according to a third weighting factor with a third phase signal to generate a third output;
a fourth means for combining the radio frequency signal weighted according to a fourth weighting factor with a fourth phase signal to generate a fourth output;
a fifth means for combining the radio frequency signal weighted according to a fifth weighting factor with a fifth phase signal to generate a fifth output;
a sixth means for combining the radio frequency signal weighted according to a sixth weighting factor with a sixth phase signal to generate a sixth output;
a seventh means for combining the radio frequency signal weighted according to a seventh weighting factor with a seventh phase signal to generate a seventh output;
an eighth means for combining the radio frequency signal weighted according to an eighth weighting factor with an eighth phase signal to generate an eighth output; and
means for summing the first, second, third, fourth, fifth, sixth, seventh, and eighth outputs to generate at least a portion of the intermediate frequency signals;
wherein:
the radio frequency signal comprises a bandwidth approximately ranging from 48 MHz to 852 MHz;
the radio frequency signal comprises a signal of interest ranging from 57 MHz to 212 MHz.

14. The circuit of claim 13, wherein:
the radio frequency signal comprises a signal of interest within the range of 106 MHz to 213 MHz; and
the means for generating comprises a frequency divider having a division factor of sixteen coupled to a plurality of delay circuits to generate the first, second, third, fourth, fifth, sixth, seventh, and eighth phase signals.

15. The circuit of claim 13, wherein:
the radio frequency signal comprises a signal of interest within the range of 57 MHz to 107 MHz; and
the means for generating comprises a frequency divider having a division factor of thirty-two coupled to a plurality of delay circuits to generate the first, second, third, fourth, fifth, sixth, seventh, and eighth phase signals.

16. The circuit of claim 13, wherein the control signal identifies at least one of a signal of interest or a particular range of frequencies associated with a signal of interest.

17. A method for frequency translating a radio frequency signal, comprising:
communicating a radio frequency signal to a selected one of a plurality of mixer stages in response to a control signal;
generating a plurality of phase signals;
combining the radio frequency signal weighted according to a first weighting factor with a first phase signal to generate a first output;
combining the radio frequency signal weighted according to a second weighting factor with a second phase signal to generate a second output;
combining the radio frequency signal weighted according to a third weighting factor with a third phase signal to generate a third output;
combining the radio frequency signal weighted according to a fourth weighting factor with a fourth phase signal to generate a fourth output; and
summing the first, second, third, and fourth outputs to generate at least a portion of the intermediate frequency signal;
wherein:

the radio frequency signal comprises a bandwidth approximately ranging from 48 MHz to 852 MHz;

the radio frequency signal comprises a signal of interest approximately ranging from 212 MHz to 424 MHz.

18. The method of claim 17, wherein the control signal identifies at least one of a signal of interest or a particular range of frequencies associated with a signal of interest.

19. A method for frequency translating a radio frequency signal, comprising:

communicating a radio frequency signal to a selected one of a plurality of mixer stages in response to a control signal;

generating a plurality of phase signals;

combining the radio frequency signal weighted according to a first weighting factor with a first phase signal to generate a first output;

combining the radio frequency signal weighted according to a second weighting factor with a second phase signal to generate a second output;

combining the radio frequency signal weighted according to a third weighting factor with a third phase signal to generate a third output;

combining the radio frequency signal weighted according to a fourth weighting factor with a fourth phase signal to generate a fourth output;

combining the radio frequency signal weighted according to a fifth weighting factor with a fifth phase signal to generate a fifth output;

combining the radio frequency signal weighted according to a sixth weighting factor with a sixth phase signal to generate a sixth output;

combining the radio frequency signal weighted according to a seventh weighting factor with a seventh phase signal to generate a seventh output;

combining the radio frequency signal weighted according to an eighth weighting factor with an eighth phase signal to generate an eighth output; and summing the first, second, third, fourth, fifth, sixth, seventh, and eighth outputs to generate at least a portion of the intermediate frequency signals;

wherein:

the radio frequency signal comprises a bandwidth approximately ranging from 48 MHz to 852 MHz;

the radio frequency signal comprises a signal of interest ranging from 57 MHz to 212 MHz.

20. The method of claim 19, wherein the control signal identifies at least one of a signal of interest or a particular range of frequencies associated with a signal of interest.

* * * * *